United States Patent
Arima et al.

(10) Patent No.: US 6,922,094 B2
(45) Date of Patent: Jul. 26, 2005

(54) DATA RETAINING CIRCUIT

(75) Inventors: Yukio Arima, Yokohama (JP);
Takahiro Yamashita, Tokyo (JP);
Koichiro Ishibashi, Warabi (JP)

(73) Assignee: Semiconductor Technology Academic Research Center, Yokohama (JP)

(*) Notice: Subject to any disclaimer, the term of this patent is extended or adjusted under 35 U.S.C. 154(b) by 0 days.

(21) Appl. No.: 10/282,862

(22) Filed: Oct. 28, 2002

(65) Prior Publication Data
US 2003/0179031 A1 Sep. 25, 2003

(30) Foreign Application Priority Data
Mar. 19, 2002 (JP) .................. 2002-076789

(51) Int. Cl.[7] .................. H03K 3/356; H03K 3/286
(52) U.S. Cl. .................. 327/208; 327/211; 327/212; 327/218
(58) Field of Search .................. 327/199–203, 327/208, 212–218; 365/156, 206

(56) References Cited

U.S. PATENT DOCUMENTS

| | | | |
|---|---|---|---|
| 5,111,429 A | * | 5/1992 | Whitaker .................. 365/156 |
| 5,525,923 A | | 6/1996 | Bialas, Jr. et al. .......... 327/210 |
| 6,026,011 A | | 2/2000 | Zhang .................. 365/154 |
| 6,259,643 B1 | * | 7/2001 | Li .................. 365/206 |
| 6,275,080 B1 | | 8/2001 | Phan et al. .................. 327/200 |
| 6,327,176 B1 | * | 12/2001 | Li et al. .................. 365/156 |

OTHER PUBLICATIONS

French Patent Office search report dated Nov. 9, 2004 for corresponding French patent Application 0214516.

K. J. Hass, et al., "Mitigating Single Event Upsets From Combinational Logic," 7th NASA Symposium on VLSI Design 1998, pp. 4.1.1–4.1.10.

* cited by examiner

*Primary Examiner*—Tuan T. Lam
(74) *Attorney, Agent, or Firm*—Christie, Parker and Hale, LLP

(57) ABSTRACT

A data retaining circuit has been disclosed in which, even if a soft error occurs, it is corrected and a normal value can be maintained, the configuration is simple, and high-speed operations are enabled. In this circuit, when a soft error occurs in the data to be put out, it is corrected by a pull-up path or a pull-down path, and when a soft error occurs in the data in the pull-up path or the pull-down path, the error data in the pull-up path or the pull-down path is prevented from affecting each other, as well as turning off the correcting function to prevent the influence on the data to be put out.

6 Claims, 16 Drawing Sheets

DATA RETAINING CIRCUIT

CROSS-REFERENCE TO RELATED APPLICATION

This application claims priority of Japanese Patent Application Number 2002-076789, filed Mar. 19, 2002.

BACKGROUND OF THE INVENTION

The present invention relates to a data retaining circuit such as a latch circuit. More particularly, the present invention relates to a data retaining circuit that reduces the occurrence of soft errors due to alpha rays, neutrons and so forth.

The semiconductor devices used in space or in aircraft have a problem of the occurrence of soft errors due to radioactive rays such as alpha rays, neutrons and so forth. Recently, semiconductor devices have been developed into those with higher integration and lower voltages, resulting in a problem that the occurrence of soft errors due to radioactive rays begins to have influence even on semiconductor devices used on the ground.

FIG. 1 is a diagram that shows the relationship between the amount of critical charge and the soft error rate due to alpha rays and neutrons in a latch circuit that is manufactured in 0.35 $\mu$m process and operates at 3.3V. The soft error rate is expressed by 1 FIT=1 error/$10^9$ device·time. As shown schematically, when the amount of critical charge is equal to or less than 75 fC, the occurrence frequency of soft errors due to alpha rays is high and when the amount of critical charge is equal to or greater than 75 fC, the occurrence frequency of the soft errors due to neutrons is high. The amount of critical charge of a latch circuit that is manufactured in 0.35 $\mu$m process and operates at 3.3V is approximately 150 fC, therefore, the problem of soft errors due to neutrons is more serious in this circuit. Devices used in space equipment or in aircraft have problems such as an increase in the failure rate of pacemakers in an aircraft. It is obvious that the increase in the occurrence of soft errors due to radioactive rays can be expected also in the semiconductor device used on the ground and the influence cannot be neglected if the structure of a semiconductor device becomes finer in the near future. Moreover, not only neutrons but also alpha rays are expected to bring about a problem of soft errors. With the above-mentioned fact as the background, countermeasures against the soft errors are required in various fields of the semiconductor device.

Although the occurrence of soft errors in a memory can be detected and corrected by providing redundant bits, countermeasures against soft errors are required also in logic circuits. In logic circuits, a data retaining circuit such as a latch circuit has largest influence when soft errors occur therein. Even if the data in such as a combinational circuit is temporarily reversed, it returns to the original one as long as the data in the former stage is not reversed, therefore, the range of the influence can be limited, but if the retained data is reversed and retained as it is the reversed data propagates and produces a far-reaching influence. Because of this, the countermeasures against soft errors in a data retaining circuit are especially required and the present invention relates to countermeasures against soft errors in a data retaining circuit.

FIG. 2A and FIG. 2B are diagrams that illustrate the mechanism of occurrence of soft errors. As shown in FIG. 2A, a transistor comprises a gate G, a source S and a drain D, and a channel is formed between the source and the drain under the gate and a depletion layer E is formed around the source and the drain. When particles such as alpha rays and neutrons enter the drain region of the transistor, many pairs of holes and electrons are generated on the trajectory of the particles due to the collision with atomic nuclei. At this time, the shape of the depletion layer becomes enlarged by the pairs of hole and electron. This region is called the funneling region F.

In the depletion layer and funneling region, electrons and holes move by drifting as shown in FIG. 2B. As movement by drifting is performed at a high speed, one group of generated charges quickly moves in the direction toward the drain, as a result. Electrons and holes generated in other than the depletion layer and the funneling region move by diffusion, but movement by diffusion is performed at a lower speed than that by a drift, therefore, almost all of the pairs of holes and electrons disappear, in pair annihilation, by annihilating each other, but part flows into the depletion layer and the funneling region and moves by drifting in the direction toward the drain.

The direction of movement of electrons is different from that of holes in NMOS and in PMOS, that is, electrons flow into the drain node in NMOS and holes do so in PMOS. At this time, when the amount of charge that flows into the drain node is larger than the amount of critical charge of the node, a phenomenon occurs in which the data retained by the transistor is reversed, which is called a soft error. In a MOS transistor, a soft error occurs characteristically in such a way as to reverse from a high logical level (data: 1) to a low logical level (data: 0) in NMOS, and in such a way as to reverse from a low logical level (data: 0) to a high logical level (data: 1) in PMOS because of each structure.

As samples of countermeasures against the soft errors in a data retaining circuit, K. Joe Hass, Jody W. Gamples: "Mitigating Single Event Upsets From Combinational Logic" 7th NASA Symposium on VLSI Design 1998 has disclosed the circuit as shown in FIG. 3, and U.S. Pat. No. 6,026,011, the circuit as shown in FIG. 4. Each circuit has a structure in which the node that retains the latched data is divided into a portion composed only of NMOS and the other portion composed only of PMOS, each having the same data and correcting the retained data for each other, the characteristic that only errors from 1 to 0 occur in NMOS and only those from 0 to 1 occur in PMOS being taken into consideration. Because each has the same data, soft errors occur only in one of them and the errors do not occur in the other, therefore, the data in which the error occurs is corrected by the data in the other portion where no error occurs.

To put it concretely, in the circuit in FIG. 3, when input data D is 0, data PP and NN to be taken in are also 0, and QP and QN become 1 and an output Q becomes 0. In this case, PP retained in the data retaining section composed of a PMOS has a possibility of the occurrence of a soft error of changing from 0 to 1, and QN retained in the data retaining section composed of an NMOS has a possibility of that of changing from 1 to 0, but it is unlikely that NN and QP reverse. When QN changes from 1 to 0, the NMOS transistor of the output section turns off, the PMOS transistor of the output section is off because QP is 1, and the output Q enters a state of floating, but the data does not reverse because of the parasitic capacitance. Then QN is brought back to the original data 1 due to NN and QP, therefore, the normal state returns. As for PP, it is also brought back to the original data 0 due to NN and QP. When the input data D is 1, there is a possibility that a soft error occurs in NN and QP, but since no soft error occurs in PP and QN, the original stage returns similarly.

In the circuit in FIG. 4, the data PP and NN are the same as the input data D and, as they are retained in the data retaining section composed of a PMOS and in that composed of an NMOS, respectively, a soft error will occur only in one of them, therefore, it is possible for them to return to the original state because they correct each other. On the other hand, the possibility that data HLD in the output data retaining section changes is very low because the outputs of two inverters, the gate inputs of which are the data PP and NN, are connected commonly and if one of the outputs changes temporarily due to a soft error, the other output is maintained correctly.

In the circuits in FIG. 3 and in FIG. 4, when the amount of charge to cause a soft error is small and the reversion of the data due to the soft error is returned to the original state in a brief time by correction, it is possible to maintain a correct state, but if the state of reversion of the data lasts a long time, the reversed data propagates to all over the circuit and the retained data is completely reversed as a result. In this case, the reversed data is retained as is. It is unlikely in actual use that the state of reversion of the data lasts so long that the retained data is completely reversed, and it does not bring any problem from a practical viewpoint. In the future, however, as semiconductor devices become finer, resulting in the reduction in capacitance components and voltages becoming lower, resulting in the reduction in the amount of critical charge, the state of data reversion caused by a soft error becomes longer accordingly and there is a possibility that the occurrence of soft errors cannot be prevented sufficiently even by using the circuits in FIG. 3 and FIG. 4.

In the circuit structures in FIG. 3 and FIG. 4, the node of the NMOS side and that of the PMOS side are connected so as to feed back each other, therefore, a problem occurs that the operation speed is slow. Moreover, another problem occurs that the structure is complicated and the size of the circuit becomes larger because many transistors are used.

The semiconductor device is required to become more dense in circuit integration, speedier, and more economical in power consumption, and the data retaining circuit such as a latch is in the same situation. It is proposed, therefore, that a pulse latch is used as a flip-flop in a structure as shown in FIG. 5. Such a latch, however, retains data dynamically, therefore, it has a characteristic that it is very weak to a soft error. It is, therefore, required that the data retaining circuit as shown in FIG. 5 has an improved resistance to soft errors.

SUMMARY OF THE INVENTION

The object of the present invention is to realize a data retaining circuit that can improve the density of integration, the operation speed, and the power consumption and has a high resistance to soft errors.

In order to realize the above-mentioned object, in the data retaining circuit in the first aspect of the present invention, when a soft error occurs in the data to be put out, it is corrected by a pull-up path or a pull-down path, and when an error occurs in the data in the pull-up path or the pull-down path, the correcting function is turned off so that the data to be put out is not affected, and simultaneously, the error data in the pull-up path and in the pull-down path are prevented from affecting each another.

In other words, the data retaining circuit in the first aspect of the present invention comprises a data retaining section that retains data to be put out, a pull-up path that takes in and retains the input data as a pull-up control signal in synchronization with a clock and pulls up the data retained in the data retaining section when the pull-up control signal has one of the values, and a pull-down path that takes in and retains the input data as a pull-down control signal in synchronization with the clock and pulls down the data retained in the data retaining section when the pull-down signal has the other value, being characterized in that the pull-up path is configured so that a soft error, in which the pull-up control signal changes the value from the other value to the one of the values, is not caused to occur, the pull-up path and the pull-down path are independent to each other, and the pull-up control signal and the pull-down control signal do not affect each other.

According to the data retaining circuit in the first aspect of the present invention, when a soft error occurs in the data retained in the data retaining section, it is corrected using the pull-up path or the pull-down path. Moreover, only the pull-up control signal retained in the pull-up path has a possibility that a soft error occurs when the input data has the one of the values, and no soft error occurs in the pull-down control signal retained in the pull-down channel. Further, only the pull-down control signal retained in the pull-down path has a possibility that a soft error occurs when the input data has the other of the values, and no soft error occurs in the pull-up control signal retained in the pull-down channel. If, therefore, it is designed so that the pull-up control signal pulls up the data in the data retaining section when the input data has the one of the values and when the input data has the other value, the pull-down control signal pulls down the data retained in the data retaining section, only the pull-up operation will be terminated even if the pull-up control signal is changed by a soft error when the input data has the one of the values, the data in the retaining section is not pulled down because the pull-down control signal does not change and, therefore, the data in the data retaining section does not change. Similarly, if the pull-down control signal retained in the pull-down path is changed because of a soft error when the input data has the other value, only the pull-down operation is terminated and, as the pull-up control signal retained in the pull-up path does not change, the data in the data retaining section is not pulled up and the data in the data retaining section does not change. In this way, even if the pull-up control signal or the pull-down control signal changes because of a soft error, the data in the retaining section does not change and the influence of the error does not propagate.

To put it concretely, the pull-up path comprises a data retaining section that retains the data to be put out, a first gate circuit composed of a transistor of a first polarity that takes in and retains the input data as a pull-up control signal in synchronization with a clock, and a first transistor of the first polarity, the pull-up control signal being applied directly to the gate of which and which pulls up the data retained in the data retaining section when the pull up control signal has the one of the values, and the pull-down path comprises a second gate circuit composed of a transistor of a second polarity that takes in and retains the input data as a pull-down control signal in synchronization with a clock and a second transistor of the second polarity, the pull-down control signal being applied directly to the gate of which and which pulls down the data retained in the retaining section when the pull-down control signal has the other value.

In such a data retaining circuit, when a soft error occurs in the data to be put out, it is corrected by the correct input data retained in the first gate circuit and the second gate circuit. In the case where the first transistor in the pull-up path is on and the second transistor in the pull-down path is off, a soft error occurs in the pull-up control signal retained in the first gate circuit, but no soft error occurs in the pull-down control signal retained in the second gate circuit. If a soft error occurs in the pull-up control signal data retained in the first gate circuit, the first transistor is turned off but the second transistor maintains in the off state, therefore, the output data is not affected. Similarly, in the case where a soft error occurs in the pull-down control signal retained in the second gate circuit, the second transistor is turned off but the first transistor remains in off stage, therefore, the output data is not affected.

If the data retaining circuit in the present invention is made to correspond to the circuit shown in FIG. 5, the above-mentioned description is modified as follows. The data retaining circuit comprises an input gate circuit that takes in and retains the input data in synchronization with a clock and an inverter, to which the data retained in the input gate circuit is applied and which is composed of a CMOS, wherein the input gate circuit is divided into a first gate circuit composed of a transistor of a first polarity and a second gate circuit composed of a transistor of a second polarity and it is designed so that a pull-up control signal retained in the first gate circuit is applied to the gate of the transistor of the first polarity of the inverter and a pull-down control signal retained in the second gate circuit is applied to the gate of the transistor of the second polarity of the inverter.

In the data retaining circuit in the first aspect of the present invention, the first gate circuit and the second gate circuit take in the input data when the transistors that make them up are on, and the taken in data is retained dynamically. Because of this, a problem occurs that it is weak to the influence of leakage. In order to suppress the leakage, there are some countermeasures such as the gate length of the transistor being lengthened and a transistor, that has a high threshold voltage, is used, but these transistors bring forth a problem that the speed of the entire latch is lowered because their operation speed is slow.

The data retaining circuit in the second aspect of the present invention is a high-speed type data retaining circuit. The data retaining circuit in the second aspect further comprises the above-mentioned pull-up path and the pull-down path in addition to the conventional data retaining circuit comprising the input gate circuit that takes in and retains the input data in synchronization with the clock and the inverter composed of the CMOS and the gate of which the data retained in the input gate circuit is applied to, and is characterized in that the data retained in the data retaining circuit is corrected by the pull-up path and the pull-down path.

In the data retaining circuit in the second aspect of the present invention, the conventional data retaining circuit uses high-speed transistors and the first gate circuit and the second gate circuit of the pull-up path and the pull-down path use transistors the operation speed of which is slow but the leakage of which is small. In this way, as the conventional data retaining circuit takes in and puts out the input data at high speed, the operation speed of the entire circuit is fast. Moreover, as the pull-up path and the pull-down path correct data so that the normal data is retained, the retained data is not lost even if the leakage in the conventional data retaining circuit is large.

There are other various countermeasures against leakage. One of them is a stack structure in which a gate circuit is further added in the former stage of the first gate circuit and the second gate circuit.

Another countermeasure is a static type in which a feedback structure is provided between the pull-down control signal and the data retained in the data retaining section, or between the pull-up control signal and the data retained in the data retaining section so that they can correct each other. In this case, the pull-up path and the pull-down path are not independent of each other and the pull-down control signal and the pull-up control signal affect each other, but if a soft error occurs either in the pull-down control signal or in the pull-up control signal, it is important to prevent the other control signal from changing so that the error does not propagate.

The data retaining circuit, therefore, in the third aspect of the present invention comprises a pull-up correcting circuit that controls the pull-up control signal according to the pull-down control signal and the data retained in the data retaining section and a pull-down correcting circuit that controls the pull-down control signal according to the pull-up control signal and the data retained in the data retaining section, in addition to the data retaining section, the pull-up path and the pull-down path, wherein the pull-up correction circuit is configured so as to terminate its control when an error occurs in the pull-down control signal or in the data retained in the data retaining section and the pull-down correcting circuit is configured so as to terminate its control when an error occurs in the pull-up control signal or in the data retained in the data retaining section. In this way, the pull-up control signal and the pull-down control signal are retained statically and, at the same time, even if an error occurs in one of them, it does not propagate to the other or to the data to be put out.

As described above, the data retaining circuit of the present invention has a simpler structure compared to the conventional ones which are provided with countermeasures against soft errors as shown in FIG. 3 and FIG. 4, and the structure prevents the influence of a soft error from affecting other parts of the circuit, therefore, it can be said that the present circuit has a characteristic that the resistance to soft errors is high.

The present invention is based on the assumption that the probability that soft errors occur simultaneously in plural parts in a circuit is very small and soft errors do not occur simultaneously in two or more pieces of data, from the viewpoint of the probability of occurrence of a soft error. Actually, it can be said that the probability that individual neutrons or alpha rays simultaneously enter plural drains that retain data is almost zero. It is, however, possible for soft errors to occur in plural pieces of data because the amount of charge a neutron generates is very large and the generated charges are collected at the plural drains of transistors that exist in the vicinity of them. If such an event occurs, it is impossible to return the state to the correct one using the present invention. It is, however, possible to prevent soft errors from actually occurring in plural pieces of data by designing the layout so that the drains of the transistors, which retain the data in which soft errors can occur at the same time, are separated on the semiconductor substrate. To put it concretely, the transistor of the first gate circuit is arranged as far as possible from the second transistor and the transistor of the second gate circuit is arranged as far as possible from the first transistor.

It is widely known that an edge-triggered type flip-flop can be configured by connecting two latches in series and by supplying a normal clock to one of them and the reversed clock, to the other. It is needless to say that an edge-triggered type flip-flop can be also realized using the data retaining circuit of the present invention.

BRIEF DESCRIPTION OF THE DRAWINGS

The features and advantages of the invention will be more clearly understood from the following description taken in conjunction with the accompanying drawings, in which.

DESCRIPTION OF THE PREFERRED EMBODIMENTS

Figure 6:
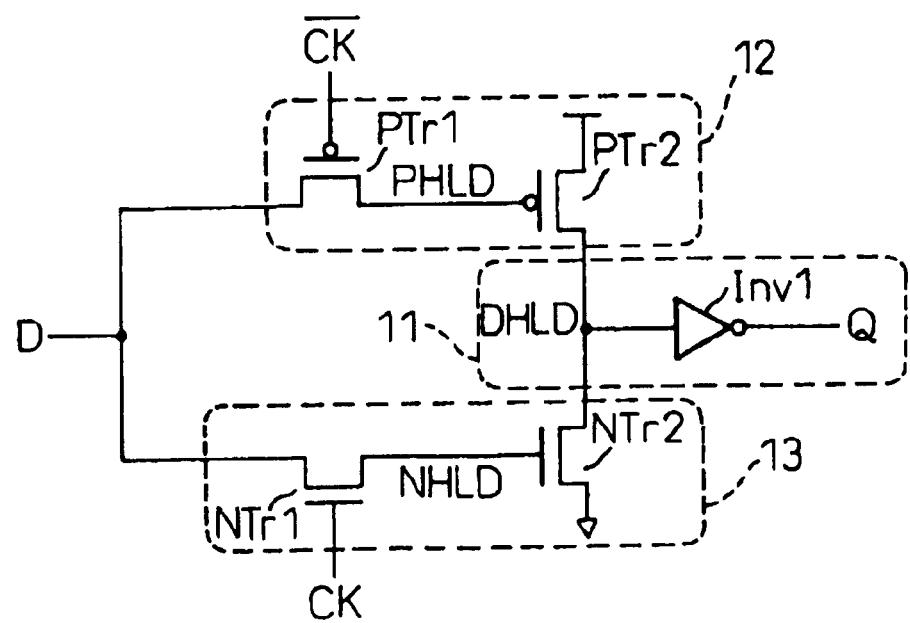
FIG. 6 is a diagram that shows the data retaining circuit in the first embodiment of the present invention.

FIG. 6 is a diagram that shows the circuit configuration of the data retaining circuit in the first embodiment of the present invention. As shown schematically, it comprises a pull-up path 12 that has a first gate circuit configured by a P-channel transistor PTr1 that takes in and retains input data D as a pull-up control signal in synchronization with a reversed clock /CK and a P-channel transistor PTr2 the gate of which the data retained at a node PHLD is directly applied to and which pulls up a node DHLD in a data retaining section 11 when the input data has one of the values 0, and a pull-down path 13 that has a second gate circuit configured by an N-channel transistor NTr1 that takes in and retains the input data D as a pull-down control signal in synchronization with a clock CK and an N-channel transistor NTr2, the gate of which the data retained at a node NHLD is directly applied to and which pulls down the node DHLD in the data retaining section when the input data has the other value 1. The data at the node DHLD is put out as an output data Q via an inverter Inv1.

Figure 1:
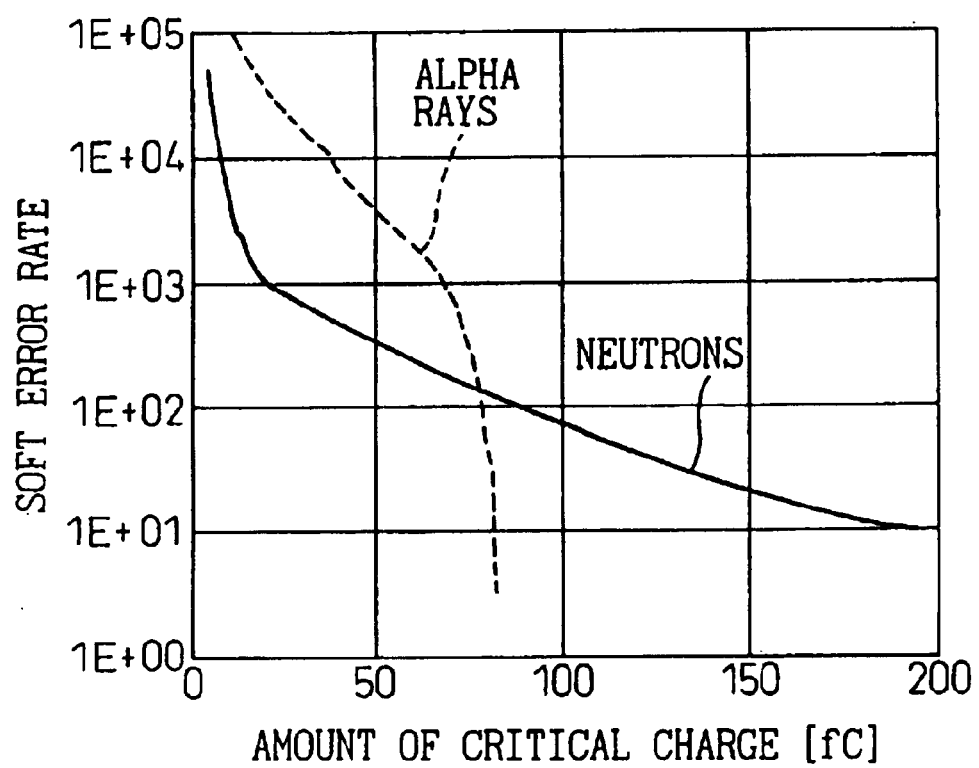
FIG. 1 is a diagram that shows an example of the soft error rate due to neutrons and alpha rays.
Figure 2A:
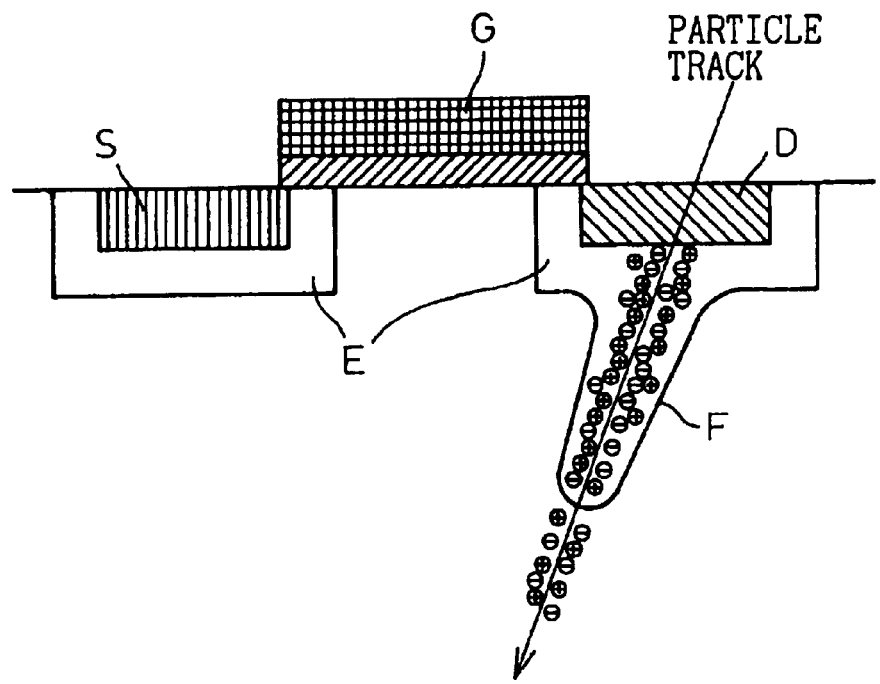
FIG. 2A and FIG. 2B are diagrams that illustrate the mechanism of the occurrence of soft errors due to neutrons and alpha rays.
Figure 2B:
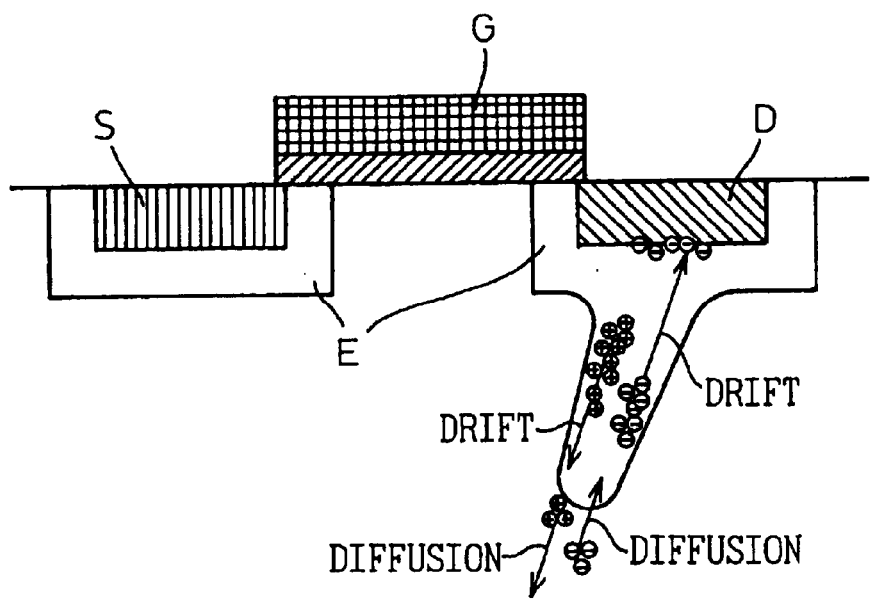
Figure 3:
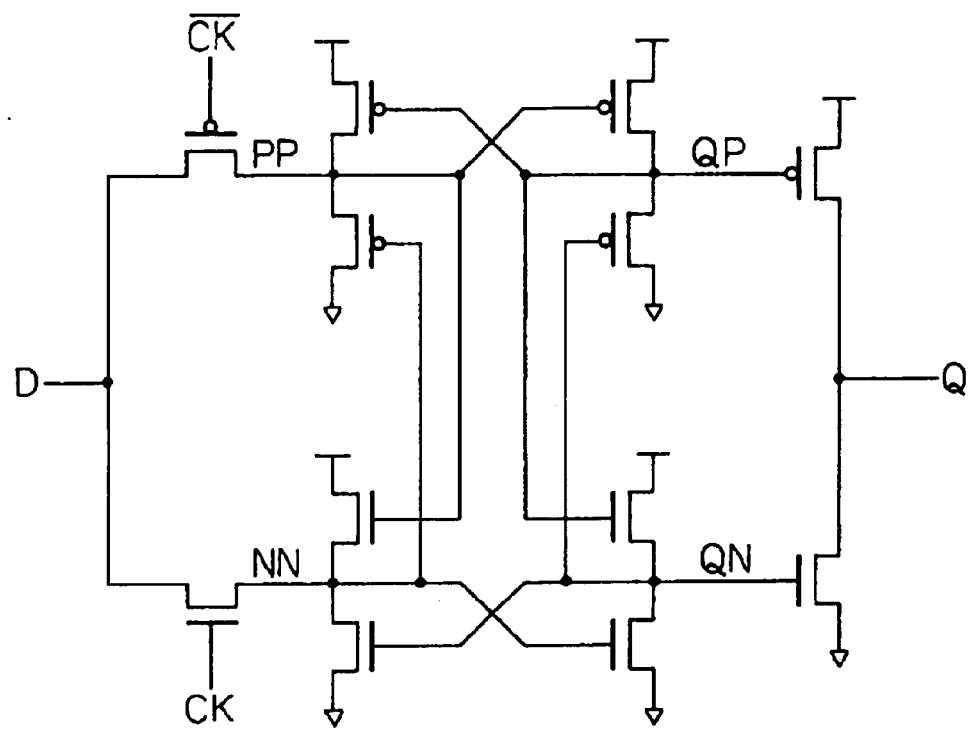
FIG. 3 is a diagram that shows the conventional data retaining circuit provided a countermeasure so as to be able to return to the original state even if a soft error occurs.
Figure 4:
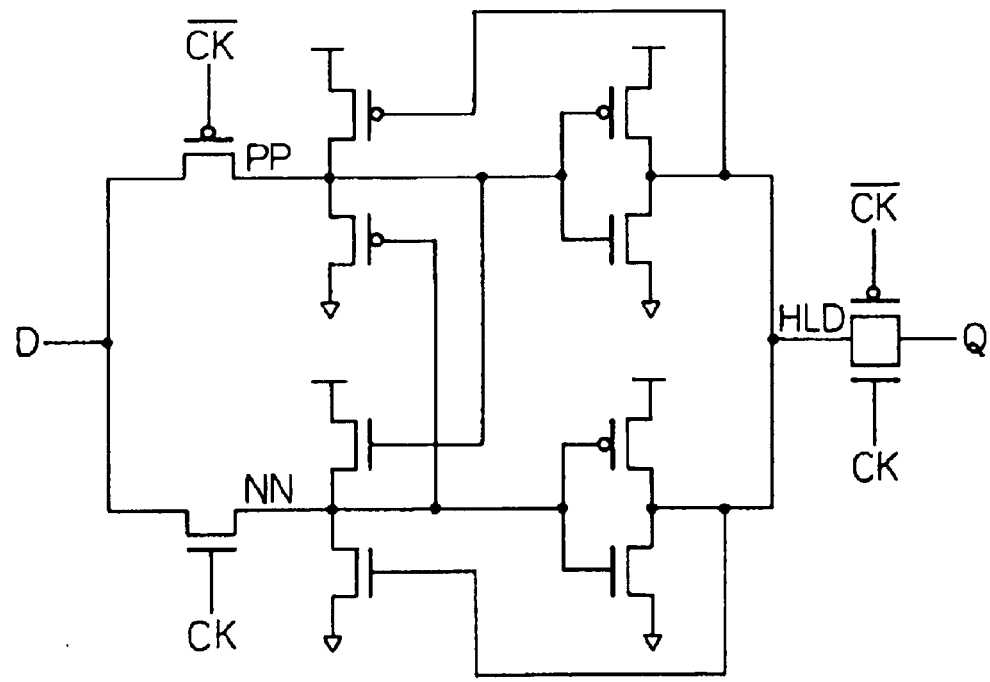
FIG. 4 is a diagram that shows the conventional data retaining circuit provided a countermeasure so as to be able to return to the original state even if a soft error occurs.
Figure 5:
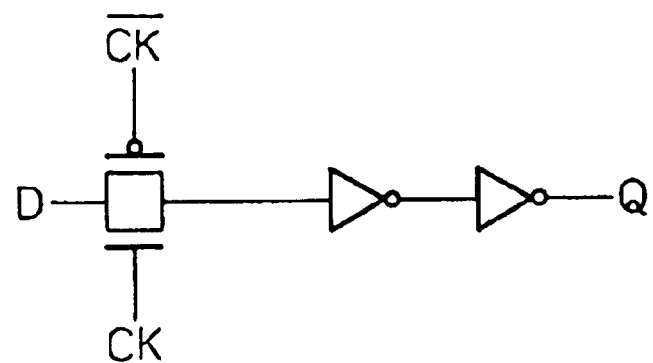
FIG. 5 is a diagram that shows a data retaining circuit in which a flip-flop is configured using a pulse latch.

In comparison with the circuit in FIG. 5, the inverter in the former state in FIG. 5 corresponds to the inverter of CMOS structure configured by the transistors PTr2 and NTr2 and the inverter in the latter stage corresponds to Inv1. The transfer gate in FIG. 5 is divided into the P-channel transistor PTr1 and the N-channel transistor NTr1, and the data at the node PHLD taken in via PTr1 is applied to the gate of PTr2 that makes up the inverter and the data at the node NHLD taken in via NTr1 is applied to the gate of NTr2.

In the data retaining circuit in the first embodiment, if a soft error occurs in the data at the node DHLD to be put out, it is corrected by the data at PHLD or NHLD without an error. When the input data D is 0, that is, the data at PHLD and NHLD is 0, PTr2 is on and NTr2 is off. In this case, there is a possibility that a soft error occurs in the data at PHLD, but no soft error occurs in the data at NHLD. When a soft error occurs in the data at PHLD and the value changes from 0 to 1, PTr2 changes from on-state to off-state. At this time, NTr2 is off and DHLD is cut off and brought into a state of floating, but the data is maintained and unchanged due to a parasitic capacitance. Similarly, when the input data D is 1, that is, the data at PHLD and NHLD is 1, PTr2 is off and NTr2 is on. In this case, there is a possibility that a soft error occurs in the data at NHLD but no soft error occurs in the data at PHLD. When a soft error occurs in the data at NHLD and the value changes from 1 to 0, NTr2 changes from on-state to off-state. At this time, PTr2 is off and DHLD is cut off and brought into a state of floating but the data is maintained and unchanged due to a parasitic capacitance.

Based on the probability of the occurrence of soft errors, the probability that plural neutrons or alpha rays cause a soft error at the same time is almost zero.

Figure 7:
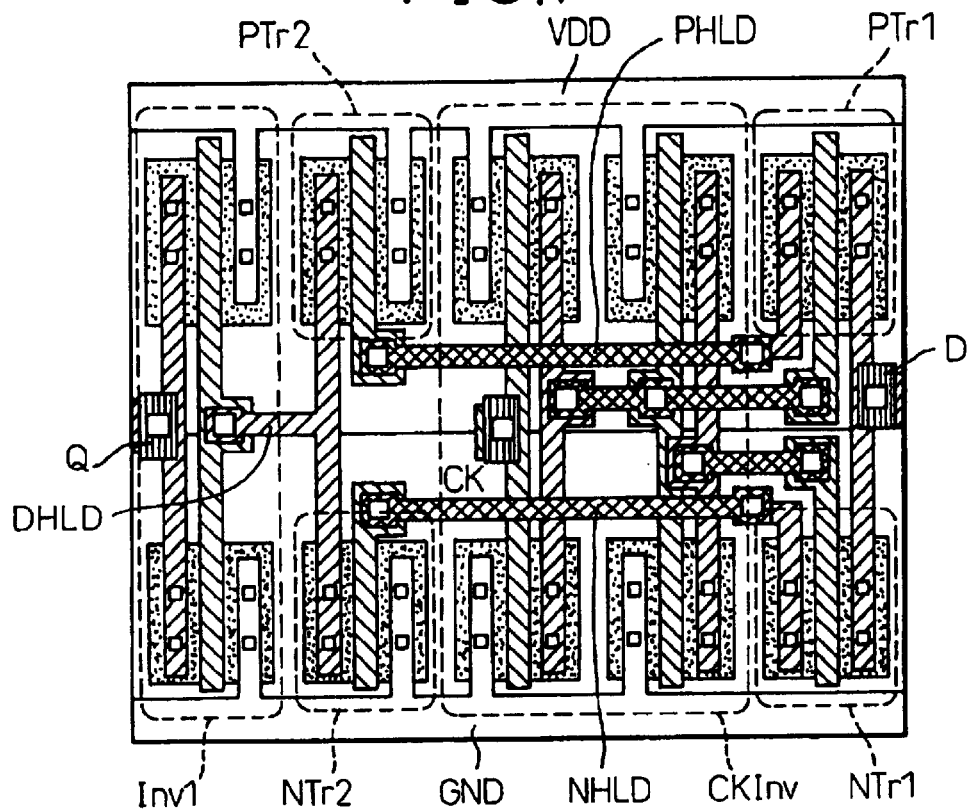
FIG. 7 is a diagram that shows the layout of the data retaining circuit in the first embodiment.

It may happen, however, that soft errors occur in plural pieces of data because the amount of charge a neutron generates is very large and hence the generated charges are collected in the plural drains of transistors. If this happens, the state cannot be returned to the correct one by the present invention. When, therefore, the data retaining circuit in FIG. 6 is realized on a substrate, PTr1 and NTr1 that generate the data at PHLD and NHLD are provided near one side of the cell, PTr2, NTr2 and Inv1 that generate the data at DHLD and Q are provided near the other side of the cell, and devices such as the inverter CKInv for clock are provided between them so that the drains of the transistors, which have the data in which soft errors may occur at the same time, are separated on the semiconductor substrate, as shown in FIG. 7. As described above, by designing the layout of the circuit so that the drains of the transistors, which have the data in which soft errors may occur at the same time, are separated as far as possible from each other, the simultaneous occurrence of the soft errors that cannot be corrected can be prevented even if a large amount of charge is generated by the collision of a neutron with a large energy.

In this way, the data retaining circuit of the present invention has a very simple configuration compared to the conventional one, but the final output signal can be maintained to have a correct value by correction even if a soft error occurs.

Figure 8:
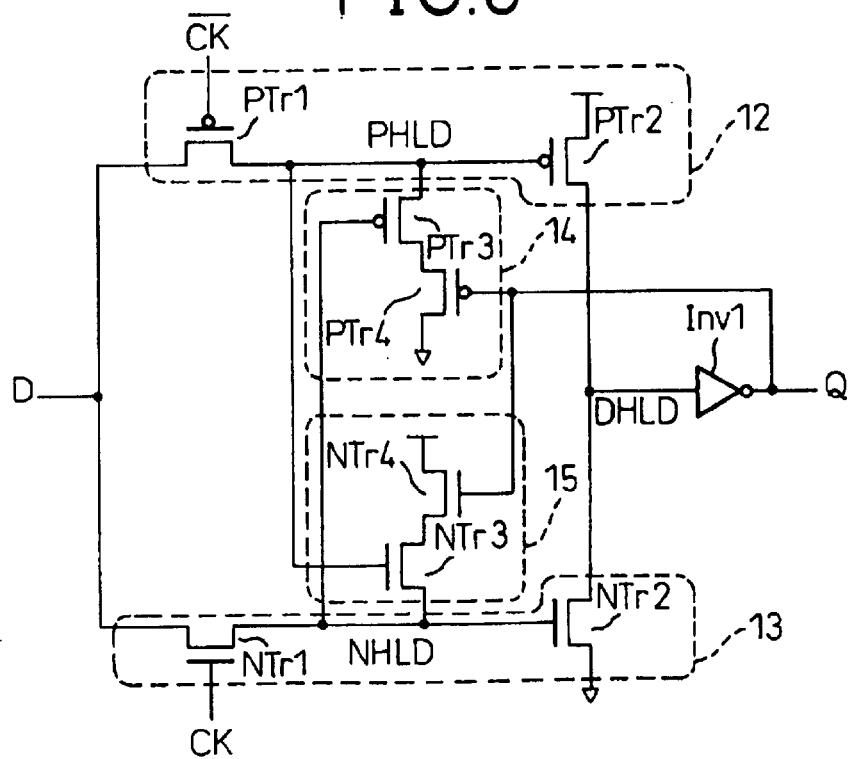
FIG. 8 is a diagram that shows the data retaining circuit in the second embodiment of the present invention.

FIG. 8 is a diagram that shows the configuration of the data retaining circuit in the second embodiment of the present invention. The data retaining circuit in the second embodiment further comprises a pull-up correcting circuit 14 that corrects the data at PHLD and a pull-down correcting circuit 15 that corrects the data at NHLD, in addition to the data retaining circuit in the first embodiment. In the pull-up correcting circuit 14, P-channel transistors PTr3 and PTr4 are connected in series between the node PHLD and the low-potential side of the power source (GND), wherein the data at NHLD is supplied to the gate of PTr3 and the output Q is supplied to the gate of PTr4. In the pull-down correcting circuit 15, N-channel transistors NTr3 and NTr4 are connected in series between the node NHLD and the high-potential side of the power source, wherein the data at PHLD is supplied to the gate of NTr3 and the output Q is supplied to the gate of NTr4. When the data at PHLD and NHLD is 0, PTr3 and PTr4 are turned on to maintain the node PHLD at the 0 level, therefore, leakage is not a problem. In other words, the data retaining circuit in the second embodiment is a static type.

Figure 9A:
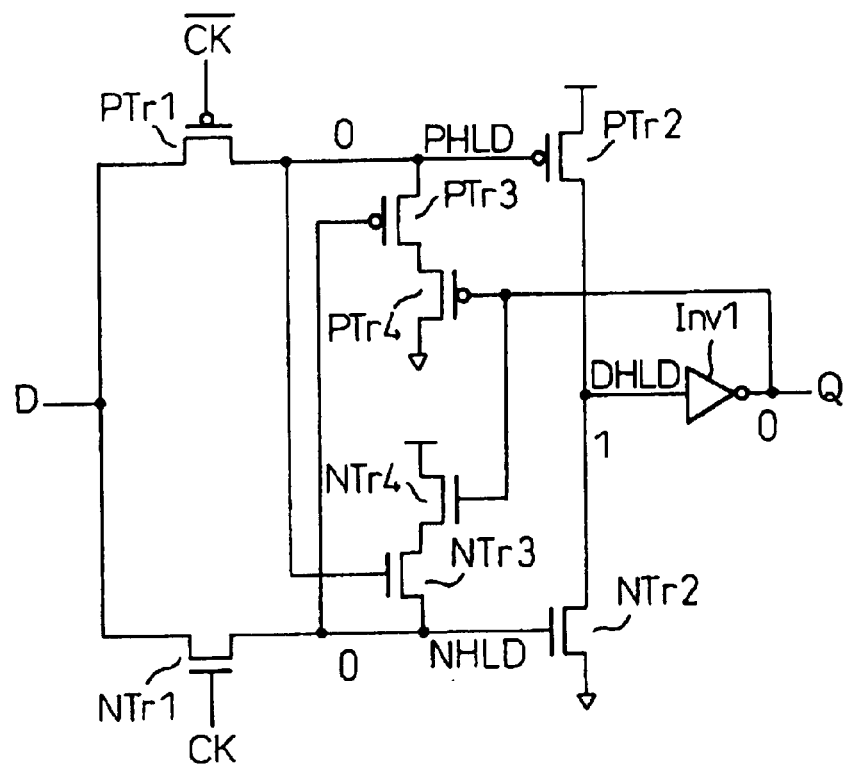
FIG. 9A and FIG. 9B are diagrams that illustrate the operations of the data retaining circuit in the second embodiment.

Next, the operations when a soft error occurs in the data retaining circuit in the second embodiment are described with reference to FIG. 9A, FIG. 9B and FIG. 10. FIG. 9A is a diagram that shows a state in which the value 0 is taken in as the input data D. After the input data D is taken in, PTr1 and NTr1 are turned off, the data at PHLD and NHLD becomes 0, PTr2 is turned on, and the data at DHLD becomes 1. NTr2 is off. PTr3 and PTr4 are turned on and NTr3 and NTr4 are turned off.

Figure 9B:
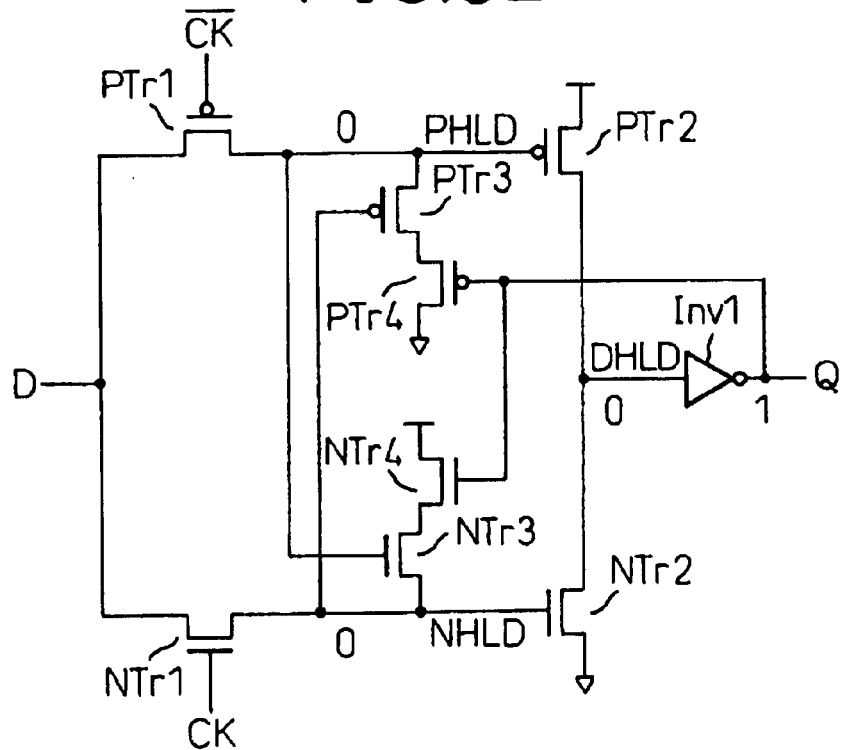

FIG. 9B shows a case where a particle enters in the vicinity of the drain of NTr2 and a soft error occurs so that the data at DHLD changes from 1 to 0. This results in the output Q changing from 0 to 1, PTr4 is turned off, and NTr4 is turned on. In this state, NTr3 remains off and the data at NHLD remains 0. The data at PHLD stops being pulled down because PTr4 is turned off but the data 0 is maintained for a certain period. PTr2 remains on and DHLD is pulled up to return to the data 1, and Q is also returns to 0. Because of this, PTr4 is turned on, NTr4 is turned off, and the state in FIG. 9A returns. In this way, even if a soft error occurs, the state returns to the correct one.

Figure 10:
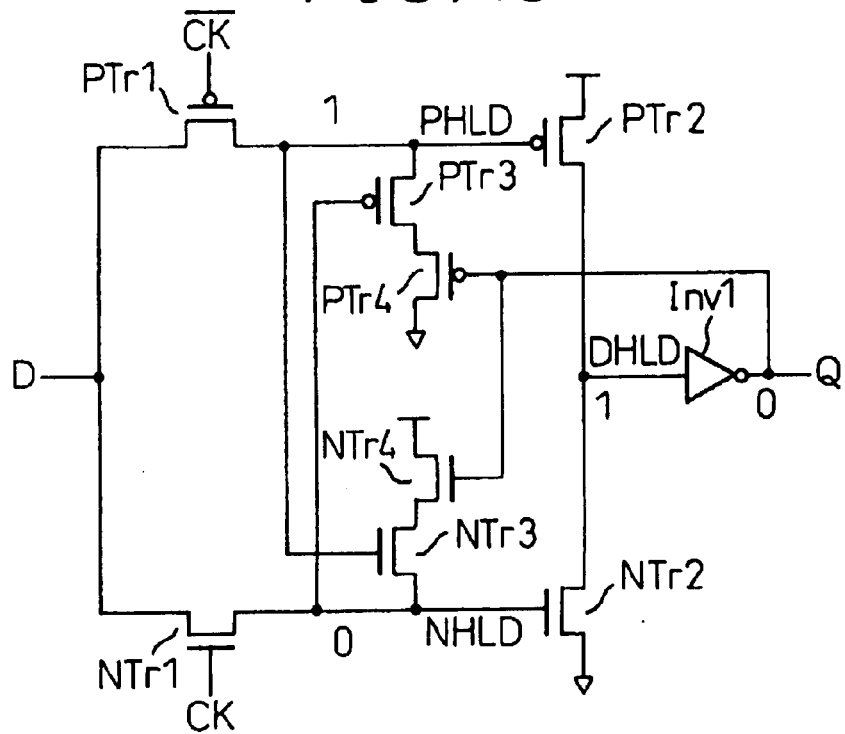
FIG. 10 is a diagram that illustrates the operations of the data retaining circuit in the second embodiment.

FIG. 10 shows a case where a particle enters in the vicinity of the drain of PTr1 and a soft error occurs so that PHLD changes from 0 to 1. This results in PTr2 changing from on-state to off-state, but NTr2 remains off, and DHLD is brought into a state of floating, but the data is maintained 1 for a certain period. During this period, since PTr3 and PTr4 remain on, PHLD is pulled down and its data becomes 0, then PTr2 is turned on again and DHLD is pulled up.

Figure 11:
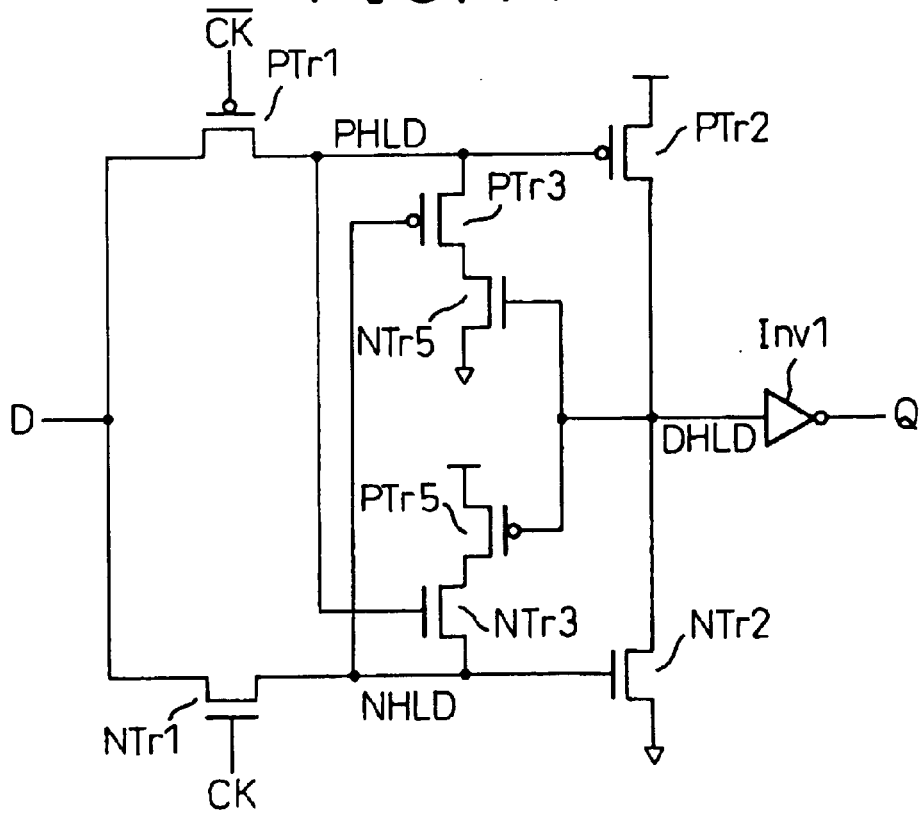
FIG. 11 is a diagram that shows a modification example of the data retaining circuit in the second embodiment.
Figure 12:
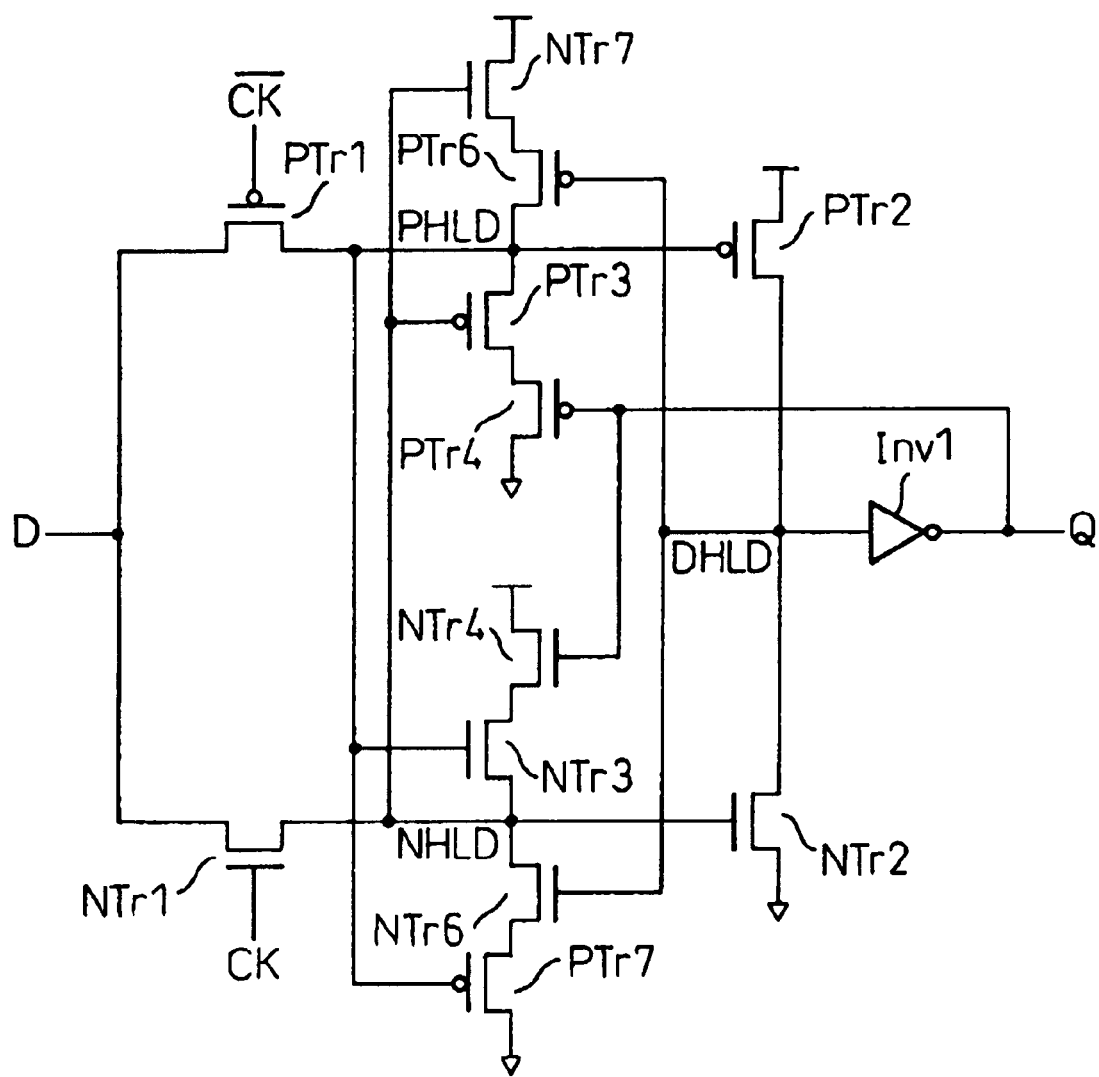
FIG. 12 is a diagram that shows a modification example of the data retaining circuit in the second embodiment.
Figure 13:
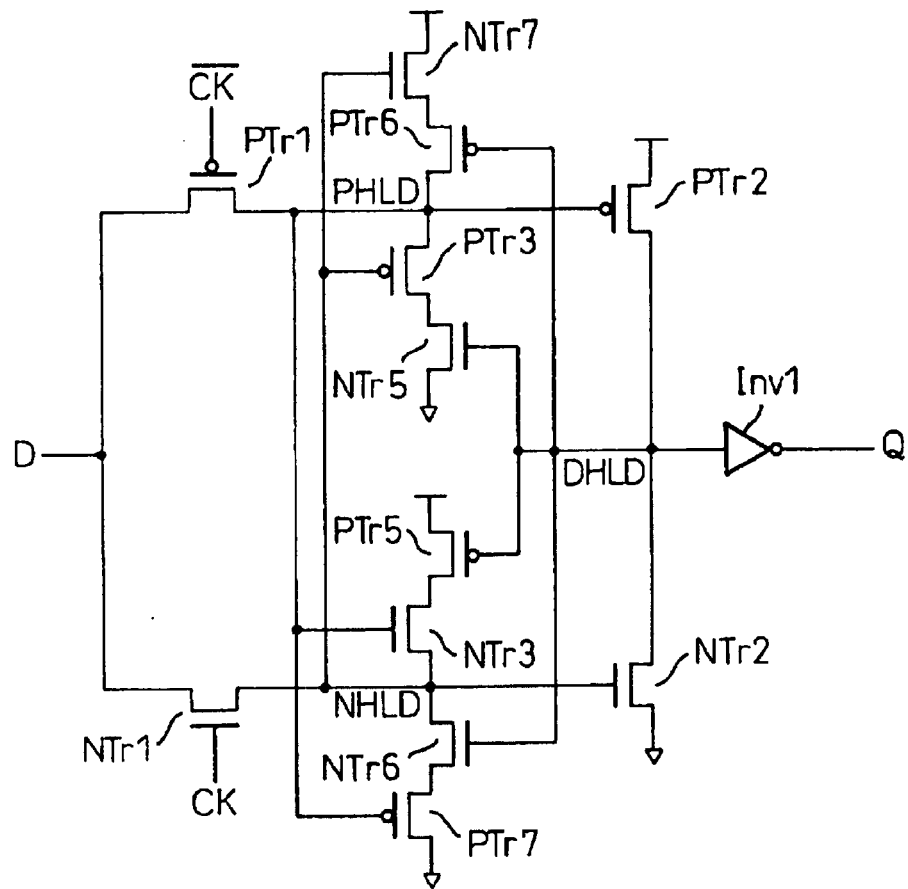
FIG. 13 is a diagram that shows a modification example of the data retaining circuit in the second embodiment.

FIG. 11 to FIG. 13 are diagrams that show modification examples of the second embodiment. In the circuit in FIG. 11, the data at DHLD, instead of the output Q, is supplied to the pull-up correcting circuit 14 and the pull-down correcting circuit 15, NTr5 is provided instead of PTr4, PTr5 is provided instead of NTr4, and the data at DHLD is supplied to each gate. As the operations are very similar to those in the circuit in the second embodiment, a description is omitted.

In the circuit in FIG. 12, a P-channel transistor PTr6 and an N-channel transistor NTr4 are connected in series between the node PHLD and the high-potential side of the power source, and the data at DHLD is supplied to the gate of PTr6 and the data at NHLD is supplied to the gate of NTr7. Moreover, an N-channel transistor NTr6 and a P-channel transistor PTr7 are connected in series between the node NHLD and the low-potential side of the power source, and the data at DHLD is supplied to the gate of NTr6 and the data at PHLD is supplied to the gate of PTr7. In the circuit in the second embodiment in FIG. 8, PHLD is pulled down only in the direction of the low-potential side and NHLD is pulled up only in the direction of the high-potential side, but in the modification example in FIG. 12, PHLD is pulled up also in the direction of the high-potential side and NHLD is pulled down also in the direction of the low-potential side. In this way, it is possible to retain the data at PHLD and NHLD more securely. As the operations are very similar to those in the circuit in the second embodiment, a description is omitted.

The circuit in FIG. 13 differs from that in FIG. 11 in that PHLD can be pulled up also in the direction of the high-potential side and NHLD can be pulled down also in the direction of the low-potential side.

Figure 14:
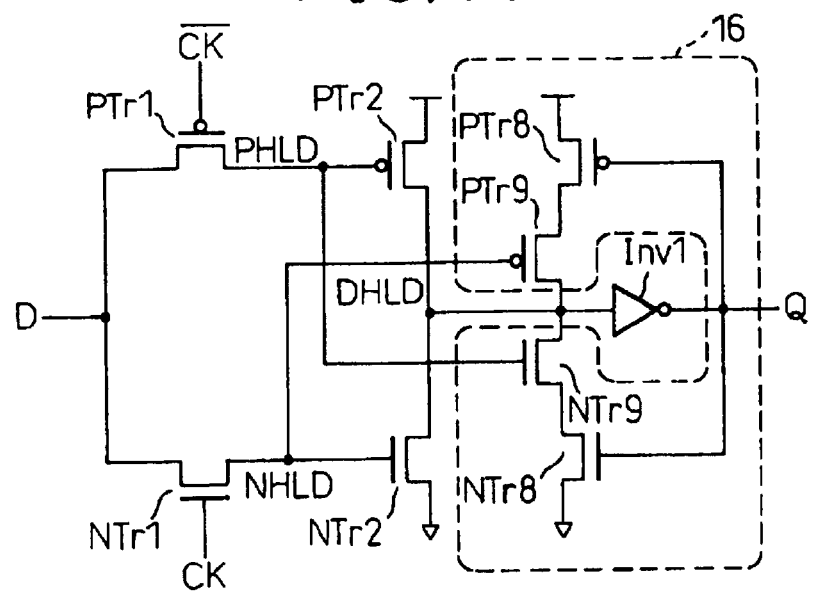
FIG. 14 is a diagram that shows the data retaining circuit in the third embodiment of the present invention.

FIG. 14 is a diagram that shows the data retaining circuit in the third embodiment of the present invention. The circuit in the third embodiment further comprises a retained data correcting circuit 16 that corrects the data at DHLD, in addition to the circuit in FIG. 6. In the retained data correcting circuit 16, P-channel transistors PTr8 and PTr9 are connected in series between the node DHLD and the high-potential side of the power source and N-channel transistors NTr8 and NTr9 are connected in series between the node DHLD and the low-potential side of the power source, wherein the gate of PTr9 is connected to PHLD, the gate of NTr9 is connected to NHLD, and the output Q is supplied to the gates of PTr8 and NTr8. In other words, the circuit in the third embodiment has a circuit configuration in which the data at DHLD is retained statically by the feedback loop of the output Q. If a soft error occurs in the data at DHLD, the feedback loop from Q to DHLD is cut off and the soft error can be prevented from propagating.

Figure 15:
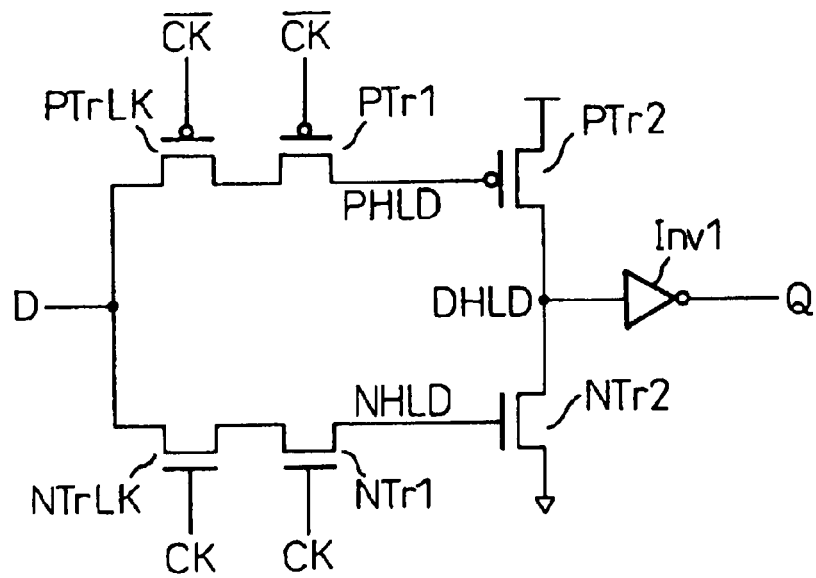
FIG. 15 is a diagram that shows the data retaining circuit in the fourth embodiment of the present invention.

FIG. 15 is a diagram that shows the data retaining circuit in the fourth embodiment of the present invention. This circuit in the fourth embodiment differs from that in FIG. 6 in that a P-channel transistor PTrLK is provided in the former stage of PTr1, an N-channel transistor NTrLK is provided in the former stage of NTr1, wherein /CK is supplied to the gate of PTrLk and CK is supplied to the gate of NTrLK. In this circuit, PTr1 and NTr1 have a two-stage configuration to suppress leakage.

Figure 16:
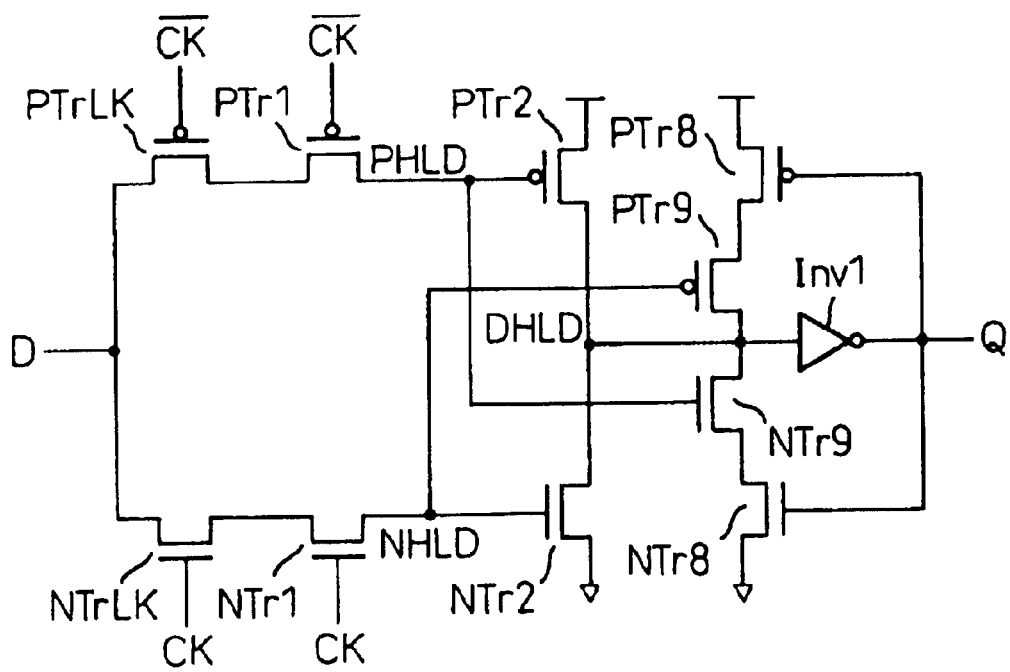
FIG. 16 is a diagram that shows a modification example of the data retaining circuit in the third embodiment.

FIG. 16 shows the data retaining circuit in the third embodiment, which is a modification example in which PTrLK and NTrLK are provided to change the data input section into a two-stage configuration.

Figure 17:
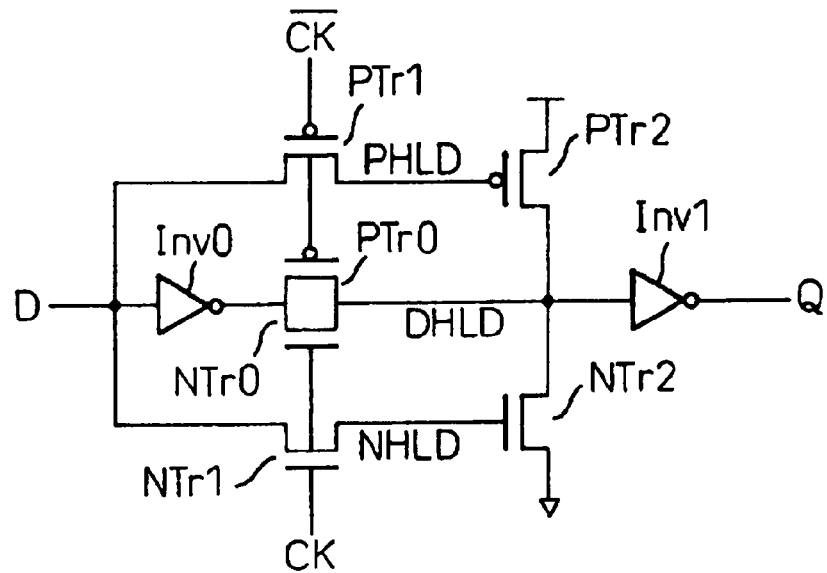
FIG. 17 is a diagram that shows the data retaining circuit in the fifth embodiment of the present invention.

FIG. 17 shows the data retaining circuit in the fifth embodiment of the present invention. The data retaining circuit in the fifth embodiment further comprises the pull-up path 12 and the pull-down path 13 shown in FIG. 6, in addition to the conventional data retaining circuit that comprises an inverter Inv0 to which the input data D is entered, a transfer gate, to which the output is entered and which takes in it in synchronization with a clock, and the inverter Inv1 that puts out the data at DHLD retained by the transfer gate. The transfer gate is configured by a P-channel transistor PTr0 and an N-channel transistor NTr0.

In the data retaining circuit in the fifth embodiment, the conventional data retaining circuit configured by the inverter Inv0, the transfer gate and the inverter Inv1 uses transistors the leakage of which can be large but the operation of which is fast. PTr1, PTr2, NTr1 and NTr2 that make up the pull-up path and the pull-down path should be selected so that their operation speed can be slow but their leakage is small. As a result, the data retaining circuit takes in and puts out the input data at a high speed, therefore, the speed of the entire circuit is fast. Moreover, the pull-up path and the pull-down path correct data so that original data is retained, therefore, it does not happen that the retained data is lost even if the leakage in the conventional data retaining circuit is large.

Figure 18:
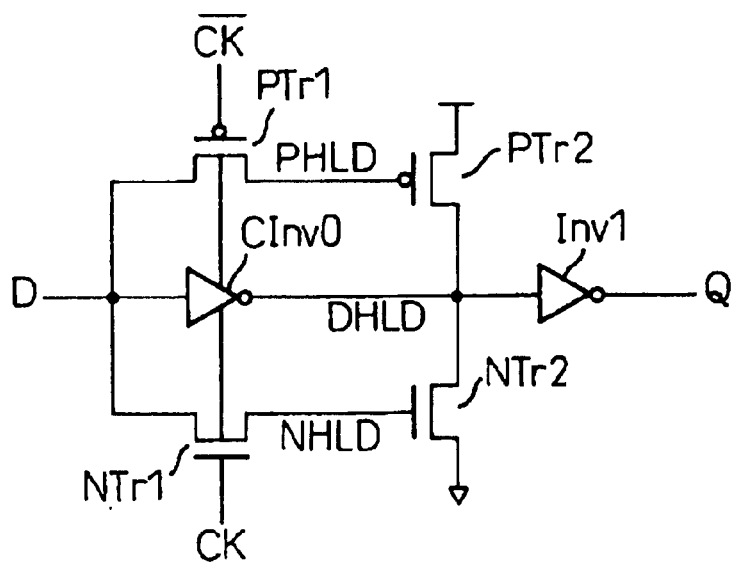
FIG. 18 is a diagram that shows a modification example of the data retaining circuit in the fifth embodiment.
Figure 19:
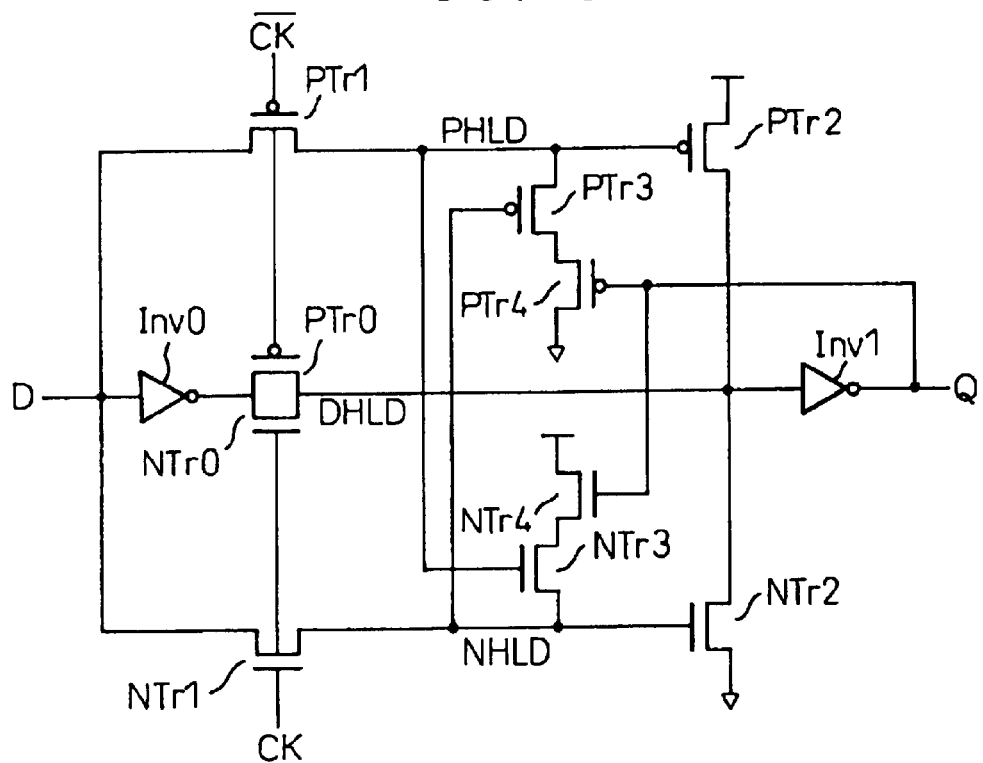
FIG. 19 is a diagram that shows a modification example of the data retaining circuit in the fifth embodiment.
Figure 20:
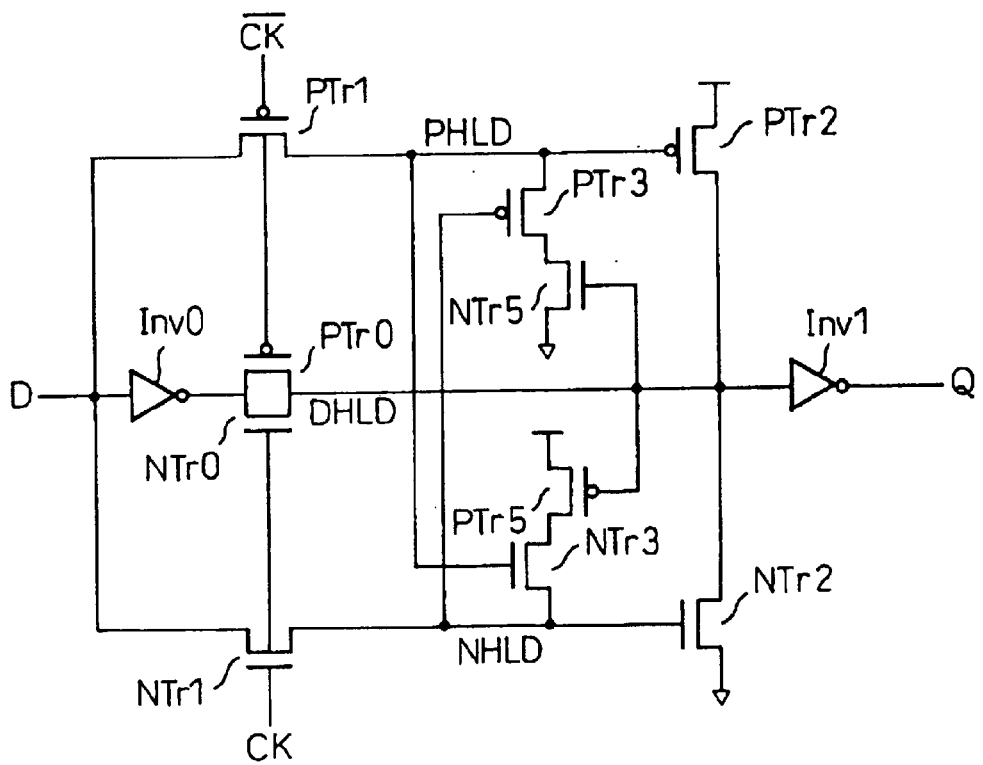
FIG. 20 is a diagram that shows a modification example of the data retaining circuit in the fifth embodiment.
Figure 21:
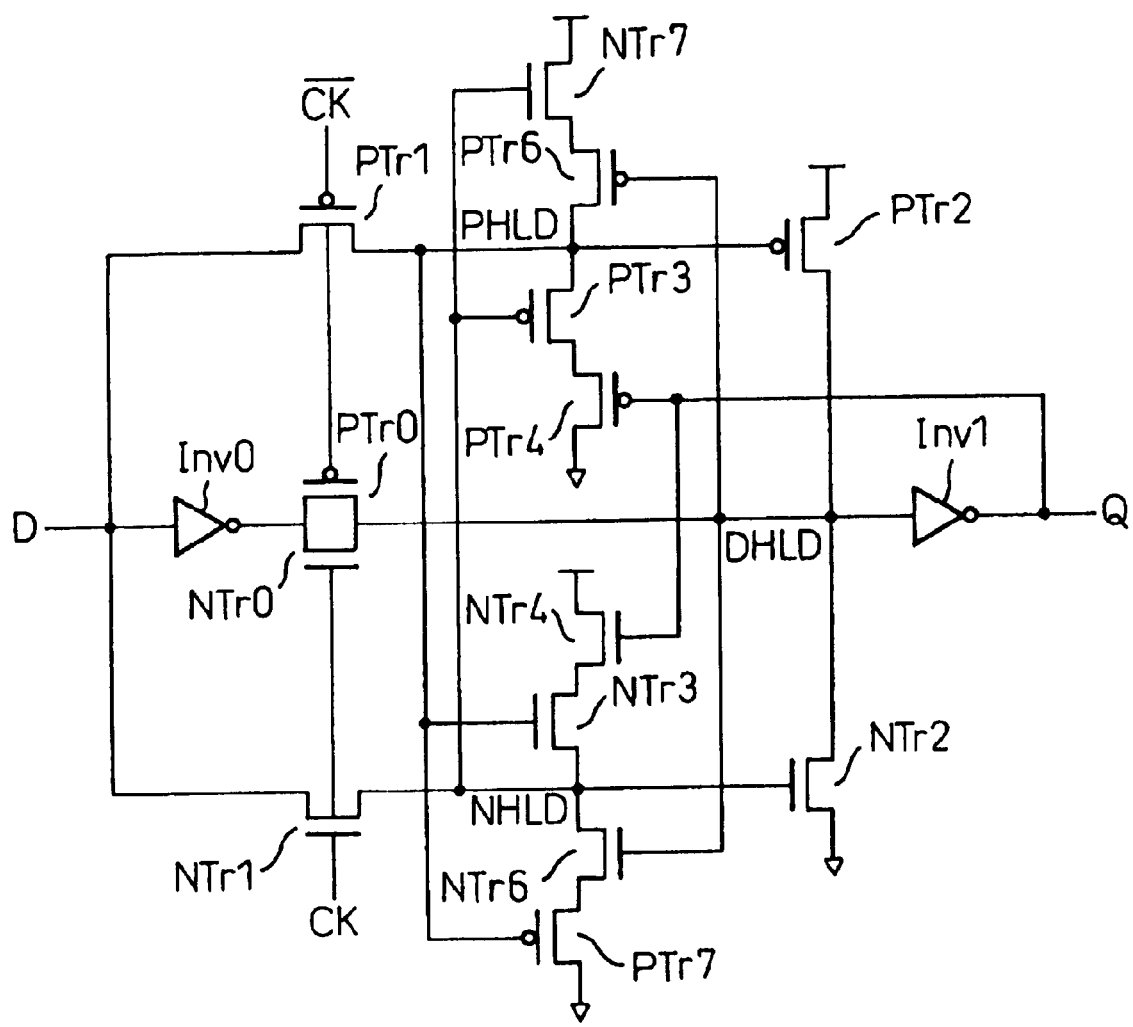
FIG. 21 is a diagram that shows a modification example of the data retaining circuit in the fifth embodiment.
Figure 22:
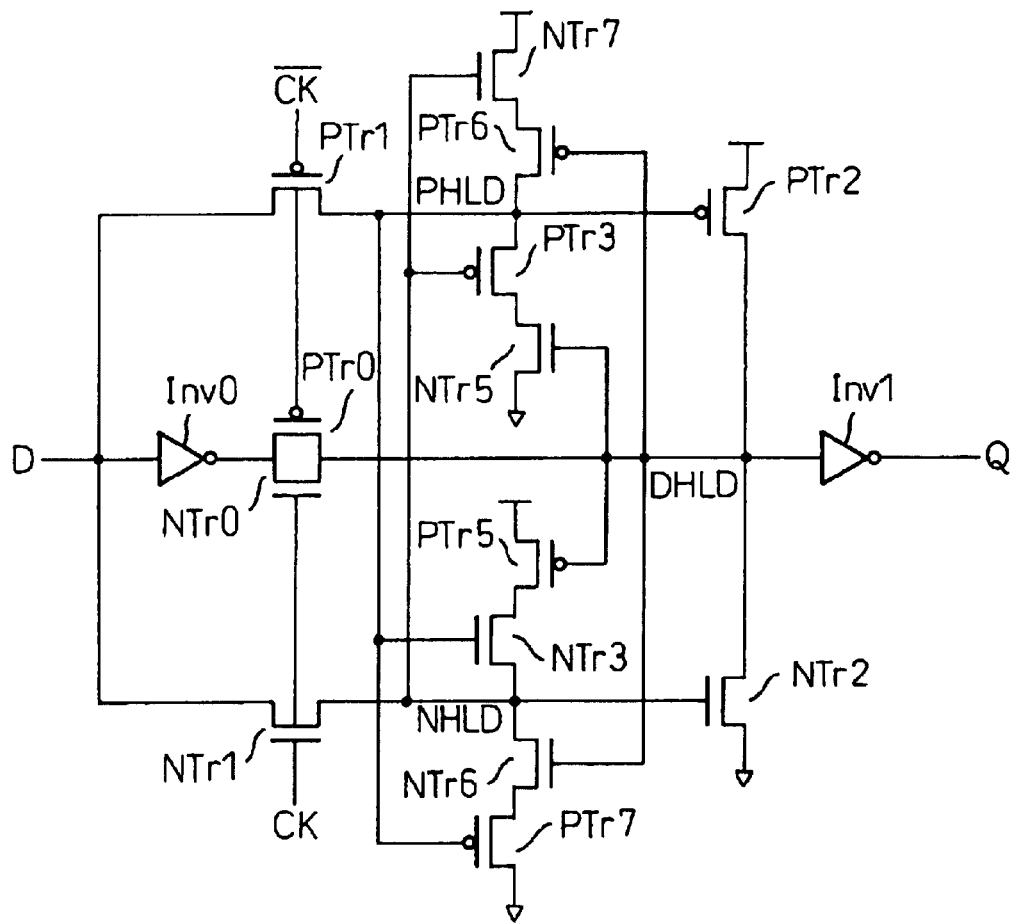
FIG. 22 is a diagram that shows a modification example of the data retaining circuit in the fifth embodiment.
Figure 23:
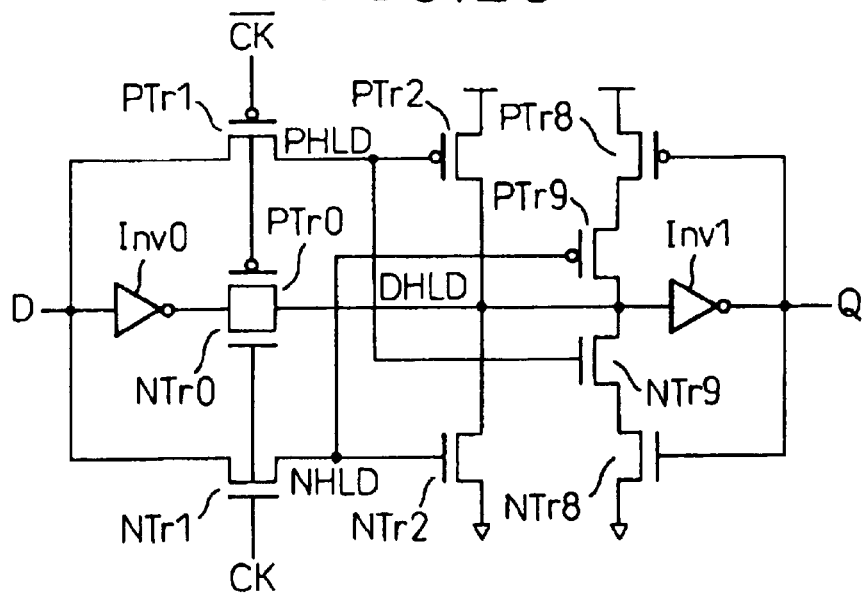
FIG. 23 is a diagram that shows a modification example of the data retaining circuit in the fifth embodiment.
Figure 24:
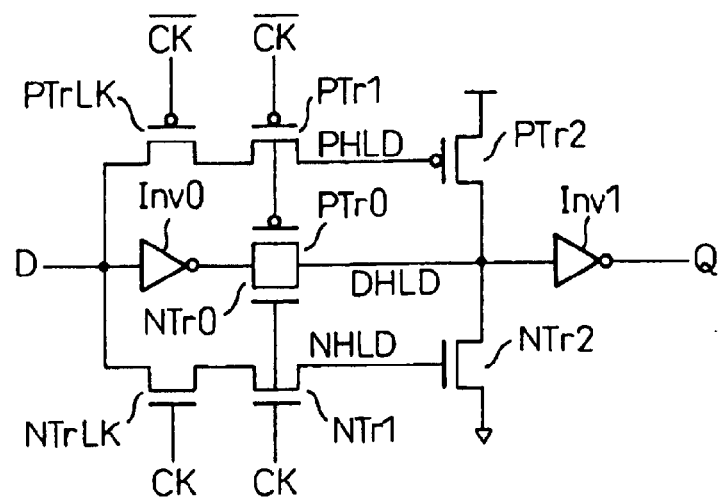
FIG. 24 is a diagram that shows a modification example of the data retaining circuit in the fifth embodiment.

FIG. 18 is a diagram that shows a modification example of the fifth embodiment, in which instead of the inverter Inv0 and the transfer gate, a clocked inverter Cinv0 that has both the functions is used. By using the clocked inverter Cinv0, the leakage is reduced but a problem occurs that the reduction in voltage is difficult to achieve.

FIG. 19 to FIG. 24 shows circuit examples in which the features shown in FIG. 8, and FIG. 11 to FIG. 15 are added, respectively, to the data retaining circuit in the fifth embodiment. A detailed description is omitted.

It is known that an edge-triggered type flip-flop can be configured by connecting two latches in series and by supplying a normal clock to one of them and the reversed clock to the other. An edge-triggered type flip-flop can be realized by using the data retaining circuit of the present invention as a latch.

Figure 25:
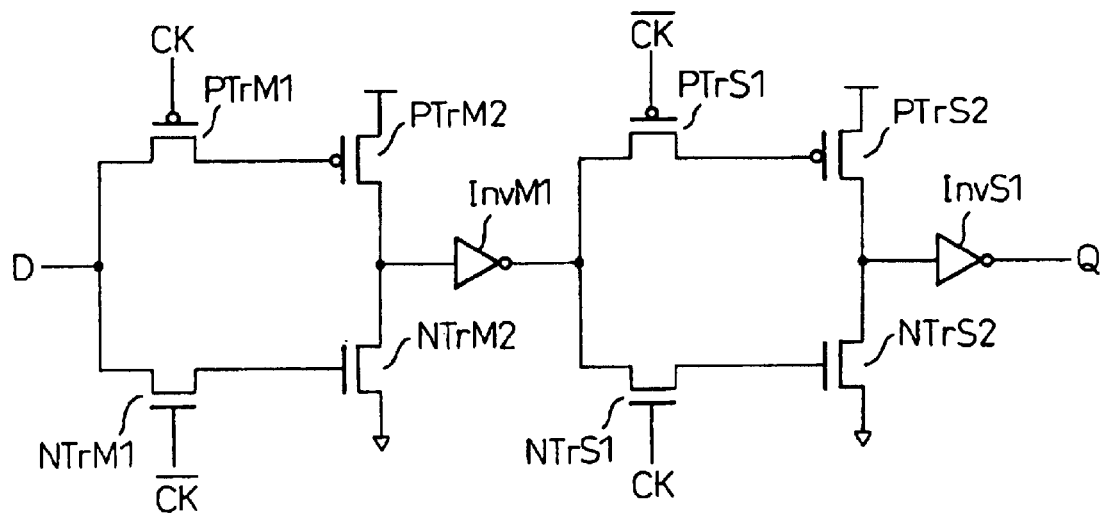
FIG. 25 is a diagram that shows an edge-triggered type flip-flop that uses the data retaining circuit in the first embodiment.
Figure 26:
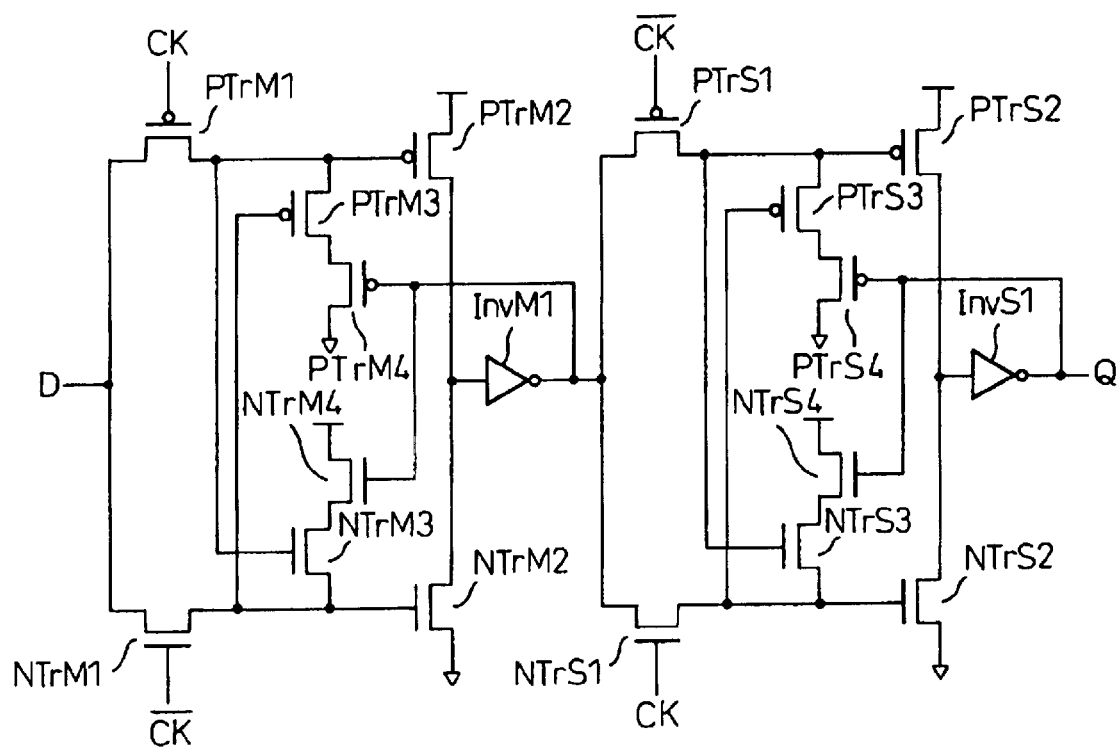
FIG. 26 is a diagram that shows an edge-triggered type flip-flop that uses the data retaining circuit in the second embodiment.

FIG. 25 shows an edge-triggered type flip-flop in which the two data retaining circuits in the first embodiment are connected in series, and FIG. 26 shows that in which the two data retaining circuits in the second embodiment are connected in series. The transistors in the master data retaining circuit in the former stage are denoted by M added to the original names and those in the slave data retaining circuit in the latter stage are denoted by S added to the original names. In either case, in the master data retaining circuit in the former stage, the input data D is taken in when the clock CK is 0 (the low-potential side level), and in the slave data retaining circuit in the latter stage, the output of the master data retaining circuit in the former stage is taken in when the clock CK is 1 (the high-potential side level).

As described above, according to the present invention, a data retaining circuit can be provided in which the final output signal can be maintained so as to have a correct value even if a soft error occurs, the configuration is simple, and the operation speed is fast. The data retaining circuit of the present invention is a basic circuit element and can be used in various circuits such as an edge-triggered type flip-flop, in which the influence of a soft error in these circuits can be prevented from propagating and malfunctions can be avoided.

We claim:

1. A data retaining circuit, comprising:
a data retaining section that retains the data to be put out;
a pull-up path that takes in and retains input data as a pull-up control signal in synchronization with a clock and pulls up the data retained in the data retaining section when the pull-up control signal is one of the values;
a pull-down path that takes in and retains input data as a pull-down control signal in synchronization with the clock and pulls down the data retained in the data retaining section when the pull-down control signal is the other value;
a pull-up correcting circuit that controls the pull-up control signal according to the pull-down control signal and the data retained in the data retaining section; and
a pull-down correcting circuit that controls the pull-down control signal according to the pull-up control signal and the data retained in the data retaining section,
wherein the pull-up path is configured so that an error in which the pull-up control signal changes from the other value to the one of the values does not occur, the pull-down path is configured so that an error in which the pull-down control signal changes from the one of the values to the other value does not occur, the pull-up correcting circuit is configured so that the control is terminated when an error occurs in the pull-down control signal or the data retained in the data retaining section, and the pull-down correcting circuit is configured so that the control is terminated when an error occurs in the pull-up control signal or the data retained in the data retaining section.

2. A data retaining circuit, as set forth in claim 1, wherein the pull-up path comprises a first gate circuit composed of a transistor of a first polarity, which takes in and retains input data as the pull-up control signal in synchronization with a clock, and a first transistor of a first polarity, the gate of which the pull-up control signal is directly applied to and which pulls up the data retained in the data retaining section when the pull-up control signal is one of the values, and the pull-down path comprises a second gate circuit composed of a transistor of a second polarity, which takes in and retains input data as the pull-down control signal in synchronization with the clock, and a second transistor of a second polarity, the gate of which the pull-down control signal is directly applied to and which pulls down the data retained in the data retaining section when the pull-down control signal is the other value.

3. A data retaining circuit, as set forth in claim 2, wherein the transistor of the first gate circuit and the second transistor are arranged so that they are not adjacent, and the transistor of the second gate circuit and the first transistor are arranged so that they are not adjacent.

4. A data retaining circuit, as set forth in claim 2, wherein the pull-up correcting circuit is connected in series between a pull-up node that retains the pull-up control signal and a power source that corresponds to the one of the values and comprises at least two transistors, the gates of which the pull-down control signal and the data retained in the data retaining section are applied to, and at least one of the two transistors to be connected to the pull-up node is a transistor of a first polarity, and the two transistors turn on when the pull-down control signal is the one of the values and the data retained in the data retaining section corresponds to the value, and turn off when the pull-down control signal is the other value and the data retained in the data retaining section corresponds to the value, and the pull-down correcting circuit is connected in series between a pull-down node that retains the pull-down control signal and a power source that corresponds to the other value and comprises at least two transistors, the gates of which the pull-up control signal and the data retained in the data retaining section are applied to, and at least one of the two transistors to be connected to the pull-down node is a transistor of a second polarity, and the two transistors turn on when the pull-up control signal is the other value and the data retained in the data retaining section corresponds to the value and turn off when the pull-up control signal is the one of the values and the data retained in the data retaining section corresponds to the value.

5. A data retaining circuit, as set forth in claim 4, wherein the pull-up correcting circuit further is connected in series between a pull-up node that retains the pull-up control signal and a power source that corresponds to the other value and comprises at least two transistors, to the gates of which the pull-down control signal and the data retained in the data retaining section are applied, and at least one of the two transistors to be connected to the pull-up node is a transistor of a first polarity, and the two transistors turn on when the pull-down control signal is the other value and the data retained in the data retaining section corresponds to the value and turn off when the pull-down control signal is the one of the values and the data retained in the data retaining section corresponds to the value, and the pull-down correcting circuit is connected in series between a pull-down node that retains the pull-down control signal and a power source that corresponds to the one of the values and comprises at least two transistors, to the gates of which the pull-up control signal and the data retained in the data retaining section are applied, and at least one of the two transistors to be connected to the pull-down node is a transistor of a second polarity, and the two transistors turn on when the pull-up control signal is the one of the values and the data retained in the data retaining section corresponds to the value and turn off when the pull-up control signal is the other value and the data retained in the data retaining section corresponds to the value.

6. A data retaining circuit that connects in series the data retaining circuit as set forth in claim 1 and supplies a clock to the data retaining circuit in the former stage or to that in the latter stage, and an inverted clock to the data retaining circuit in the latter stage or to that in the former stage.

* * * * *